(12) United States Patent
Long et al.

(10) Patent No.: US 10,649,006 B2
(45) Date of Patent: May 12, 2020

(54) CATHODE RF ASYMMETRY DETECTION PROBE FOR SEMICONDUCTOR RF PLASMA PROCESSING EQUIPMENT

(71) Applicant: Lam Research Corporation, Fremont, CA (US)

(72) Inventors: Maolin Long, Santa Clara, CA (US); Alex Paterson, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 385 days.

(21) Appl. No.: 15/727,421

(22) Filed: Oct. 6, 2017

(65) Prior Publication Data

US 2019/0107558 A1  Apr. 11, 2019

(51) Int. Cl.
| | | |
|---|---|---|
| *G01R 1/067* | (2006.01) | |
| *H01L 21/683* | (2006.01) | |
| *H01J 37/32* | (2006.01) | |

(52) U.S. Cl.
CPC .... *G01R 1/06772* (2013.01); *H01J 37/32082* (2013.01); *H01J 37/32935* (2013.01); *H01L 21/6831* (2013.01)

(58) Field of Classification Search
CPC .............. G01R 1/06772; G01R 31/343; H01L 21/67069; H01L 21/6831; G01N 22/00; H01J 37/32082; H01J 37/32935; F24F 13/00

USPC ........................ 324/600, 676, 500, 750.12, 324/754.01–754.24, 754.16, 755.1, 690, 324/76.11, 144, 149, 200, 244; 427/8, 427/523, 569; 257/E21.218, E21.311, 257/E21.143; 156/345.35–345.51
See application file for complete search history.

(56) References Cited

U.S. PATENT DOCUMENTS

| | | | |
|---|---|---|---|
| 6,853,953 B2 | 2/2005 | Brcka et al. | |
| 8,022,718 B2 | 9/2011 | Avoyan et al. | |
| 9,017,513 B2 | 4/2015 | Gosselin | |
| 2003/0141821 A1* | 7/2003 | Nakano | H01J 37/32082 315/111.21 |
| 2008/0075834 A1* | 3/2008 | Ramaswamy | C23C 14/48 427/8 |

* cited by examiner

*Primary Examiner* — Melissa J Koval
*Assistant Examiner* — Trung Nguyen
(74) *Attorney, Agent, or Firm* — Weaver Austin Villeneuve & Sampson LLP

(57) ABSTRACT

Apparatuses, systems, and techniques for characterizing asymmetry effects caused by cathode designs, ESC designs, cable routing, and process chamber geometries are provided. Such apparatuses, systems, and techniques may include, for example, a rotatable RF probe assembly in physical contact to a conductive plate disposed on a surface of a pedestal.

24 Claims, 6 Drawing Sheets

CATHODE RF ASYMMETRY DETECTION PROBE FOR SEMICONDUCTOR RF PLASMA PROCESSING EQUIPMENT

BACKGROUND

Semiconductor processing chambers may include RF electrodes that are configured to generate an electromagnetic field that may be used to induce a plasma or other processing condition within the chamber. In many typical semiconductor processing chambers, one of these electrodes may be mounted or located within a wafer support or pedestal, e.g., in a wafer chuck that may be part of the wafer support or pedestal. Systems and methods for improving or evaluating the performance of such electrodes are discussed herein.

SUMMARY

Figure 1:
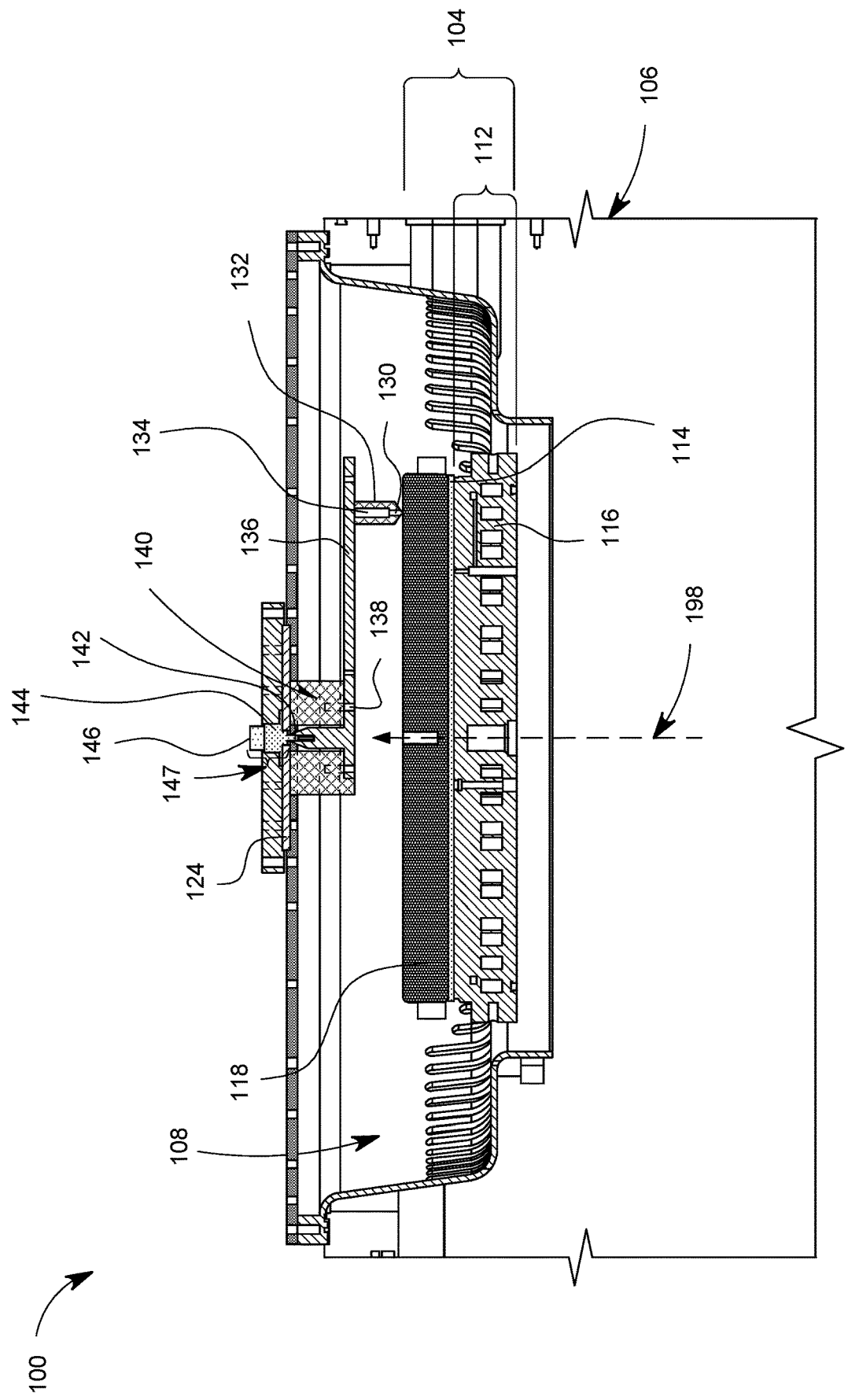
FIG. 1 depicts a cross-sectional view of an example configuration of a probe assembly for measuring asymmetry effects in a semiconductor processing chamber.

The systems, methods and devices of this disclosure each have several innovative aspects, no single one of which is solely responsible for the desirable attributes disclosed herein. Included among these aspects are at least the following implementations, although further implementations may be set forth in the detailed description or may be evident from the discussion provided herein.

In some embodiments, an apparatus for evaluating radio-frequency (RF) electromagnetic field symmetry of an electrode of a pedestal of a semiconductor processing chamber may be provided. The apparatus may include a radio-frequency (RF) probe assembly configured to rotate about a first axis relative to a grounding plate. The grounding plate may be configured to interface with the semiconductor processing chamber and may include an aperture. The RF probe assembly may include a radial member positioned on a first side of the grounding plate that faces the pedestal when the grounding plate is interfaced with the semiconductor processing chamber. The RF probe assembly may also include a first conductive pin that is supported by the radial member and radially offset from the first axis along a second axis perpendicular to the first axis. The RF probe assembly may also include a first electrically conductive path leading from the first conductive pin, through the aperture, and to a location accessible from a second side of the grounding plate that is opposite the first side, where the first electrically conductive path is electrically isolated from the grounding plate.

In some implementations, the first electrically conductive path may terminate at a coaxial RF connector assembly.

In some implementations, the apparatus may further include a network analyzer and the first electrically conductive path may be coupled to the network analyzer in order to obtain or make a measurement of resistance, capacitance, and/or impedance.

In some implementations, the RF probe assembly may further include a sliding member that may be configured to translate along the second axis and may be supported by the radial member. The sliding member may support the first conductive pin.

In some implementations, the RF probe assembly may further include a linear translation mechanism that may be configured to translate the sliding member along the second axis responsive to a mechanical input provided to a mechanism accessible from the second side and the linear translation mechanism may include at least one mechanism such as 1) a lead screw, 2) a rack and pinion, and/or 3) a chain or belt drive.

In some implementations, the RF probe assembly may further include a second conductive pin supported by the radial member and the second conductive pin may be coupled to a second electrically conductive path. In such implementations, the first electrically conductive path and the second electrically conductive path may be coupled to a multiplexer configurable to select between the first conductive pin and the second conductive pin.

In some implementations, the first conductive pin may be spring-loaded such that the first conductive pin may be biased to slide away from the grounding plate and along an axis parallel to the first axis.

In some implementations, the apparatus may further include an insulator between the grounding plate and the radial member, the insulator having a first end accessible from the second side of the grounding plate and a second end connected to the radial member such that rotation of the insulator along the first axis may cause a rotation of the radial member along the first axis. In such implementations, a length of the insulator may provide a separation distance along the first axis between the grounding plate and the radial member and the insulator may be made of electrically insulating solid material, such as, for example a ceramic material, Teflon, a silicone, and/or a polyimide.

In some implementations of the apparatus, the apparatus may further include an electrically conductive plate configured to contact a first end of the first conductive pin. In such implementations, the first end of the first conductive pin may be oriented away from the first side of the grounding plate and the electrically conductive plate may be made of material (or made of material containing) such as aluminum or brass.

In some implementations, the apparatus may further include a semiconductor processing chamber having the pedestal and the grounding plate may be interfaced to the semiconductor processing chamber.

In some such implementations, the apparatus may further include a semiconductor processing tool that includes the semiconductor processing chamber and the pedestal and the pedestal may include an electrostatic chuck and a high-voltage radio frequency (RF) generator configured to provide RF energy.

In some implementations, the electrically conductive plate may be interposed between the first conductive pin and the pedestal and may have a thickness that may cause the electrically conductive plate to simultaneously contact the first conductive pin and the pedestal when the electrically conductive plate is supported by the pedestal and the pedestal is at a first height in the semiconductor processing chamber. In such implementations, the electrically conductive plate may have a diameter that is substantially similar to a diameter of the pedestal.

In one implementation, a method for operating an apparatus for evaluating radio-frequency (RF) electromagnetic field symmetry of an electrode of a pedestal of a semiconductor processing chamber may be provided. The method may include, for example, measuring a first radio-frequency (RF) signal at a first position using a RF probe assembly, the RF probe assembly configured to rotate about a first axis relative to a grounding plate, the grounding plate configured to interface with the semiconductor processing chamber, the grounding plate including an aperture. The RF probe assembly may include a radial member positioned on a first side of the grounding plate that faces the pedestal when the grounding plate is interfaced with the semiconductor processing chamber, a first conductive pin that is supported by the radial member and radially offset from the first axis along a second axis perpendicular to the first axis, and a first electrically conductive path leading from the first conductive pin, through the aperture, and to a location accessible from a second side of the grounding plate that is opposite the first side; the first electrically conductive path may be electrically isolated from the grounding plate. The method may further include measuring a second radio-frequency (RF) signal at a second position using the RF probe assembly; the first position and the second position may be symmetric in a plane parallel to the second axis.

In some implementations of the method, the first electrically conductive path may terminate at a coaxial RF connector assembly.

In some implementations of the method, the apparatus may further include a network analyzer, and the method may include coupling the first electrically conductive path to the network analyzer for making a measurement of, for example, resistance, capacitance, and/or impedance.

In some implementations of the method, the RF probe assembly may further include a sliding member that is configured to translate along the second axis and is supported by the radial member. In such implementations, the sliding member may support the first conductive pin, and the method may further include obtaining multiple measurements from the first conductive pin for various positions of the first conductive pin along the second axis.

In some implementations of the method, the RF probe assembly may further include a linear translation mechanism configured to translate the sliding member along the second axis responsive to a mechanical input provided to a mechanism accessible from the second side. The linear translation mechanism may include at least one mechanism such as 1) a lead screw, 2) a rack and pinion, and/or 3) a chain or belt drive, and the method may further include activating the linear translation mechanism to move the first conductive pin to each position along the second axis at which a measurement is obtained.

In some implementations of the method, the RF probe assembly may further include a second conductive pin supported by the radial member, the second conductive pin being coupled to a second electrically conductive path. In such implementations, the first electrically conductive path and the second electrically conductive path may be coupled to a multiplexer configurable to select between the first conductive pin and the second conductive pin, and the method may further include switching an input of the multiplexer between the first electrically conductive path and the second electrically conductive path.

In some implementations of the method, the first conductive pin may be spring-loaded such that the first conductive pin is biased to slide away from the grounding plate and along an axis parallel to the first axis.

In some implementations of the method, the apparatus may further include an insulator between the grounding plate and the radial member. The insulator may have a first end accessible from the second side of the grounding plate and a second end connected to the radial member such that rotation of the insulator along the first axis causes a rotation of the radial member along the first axis. A length of the insulator may provide a separation distance along the first axis between the grounding plate and the radial member, and the insulator may be made of electrically insulating solid material such as a ceramic material, Teflon, a silicone, and/or a polyimide.

In some implementations of the method, the apparatus may further include an electrically conductive plate configured to contact a first end of the first conductive pin; the first end of the first conductive pin may be oriented away from the first side of the grounding plate and the electrically conductive plate may be made of material (or made from material containing such material) such as aluminum and/or brass. In such implementations, the method may further include placing the electrically conductive plate on the pedestal such that the electrically conductive plate is in electrically conductive contact with the pedestal and with the first conductive pin.

In some implementations of the method, the apparatus may further include a semiconductor processing chamber having the pedestal, and the method may further include interfacing the grounding plate to the semiconductor processing chamber.

In some implementations of the method, the apparatus may further include a semiconductor processing tool that includes the semiconductor processing chamber and the pedestal, the pedestal including an electrostatic chuck, and a high-voltage radio frequency (RF) generator configured to provide RF energy.

In some implementations of the method, the electrically conductive plate may be interposed between the first conductive pin and the pedestal, and the electrically conductive plate may have a thickness that causes the electrically conductive plate to simultaneously contact the first conductive pin and the pedestal when the electrically conductive plate is supported by the pedestal and the pedestal is at a first height in the semiconductor processing chamber, and the electrically conductive plate may have a diameter that is substantially similar to a diameter of the pedestal.

These and other implementations are described in further detail with reference to the Figures and the detailed description below.

DETAILED DESCRIPTION

Semiconductor processing chambers may frequently exhibit structural asymmetry, e.g., due to wafer loading interfaces, pedestal support structures, cable routing, etc., which in turn may induce asymmetry in the RF field distribution in the process chamber during semiconductor processing. Furthermore, during semiconductor processing operations, a semiconductor wafer is typically supported on a pedestal within a processing chamber. The wafer may be held in place with respect to the pedestal using a "chuck," which is a device that augments the force of gravity with some other type of clamping force that enforces the contact between the wafer and the pedestal/chuck in order to improve heat transfer between the wafer and the pedestal/chuck. Inside of some chucks are electrodes for applying a DC clamping bias, and in certain designs, RF energy may also be applied via the chuck. Asymmetry in the chuck can also manifest as asymmetry in the RF field distribution during semiconductor processes, including, but not limited to, etching operations. Additionally, the processing chamber may also include cables for providing the DC and RF power, along with control signals, which further introduce asymmetry affects depending on cable positioning. Discussed herein are techniques and apparatuses for measuring RF asymmetry effects caused by the design of the chuck, the electrodes, the process chamber, the positioning of the cables, and various other design features.

In the following description, numerous specific details are set forth in order to provide a thorough understanding of the presented concepts. The presented concepts may be practiced without some or all of these specific details. In other instances, well known process operations have not been described in detail so as to not unnecessarily obscure the described concepts. While some concepts will be described in conjunction with the specific implementations, it will be understood that these implementations are not intended to be limiting.

There are many concepts and implementations described and illustrated herein. While certain features, attributes and advantages of the implementations discussed herein have been described and illustrated, it should be understood that many others, as well as different and/or similar implementations, features, attributes and advantages of the present inventions, are apparent from the description and illustrations. As such, the above implementations are merely exemplary. They are not intended to be exhaustive or to limit the disclosure to the precise forms, techniques, materials and/or configurations disclosed. Many modifications and variations are possible in light of this disclosure. It is to be understood that other implementations may be utilized and operational changes may be made without departing from the scope of the present disclosure. As such, the scope of the disclosure is not limited solely to the description above because the description of the above implementations has been presented for the purposes of illustration and description.

Importantly, the present disclosure is neither limited to any single aspect nor implementation, nor to any single combination and/or permutation of such aspects and/or implementations. Moreover, each of the aspects of the present disclosure, and/or implementations thereof, may be employed alone or in combination with one or more of the other aspects and/or implementations thereof. For the sake of brevity, many of those permutations and combinations will not be discussed and/or illustrated separately herein.

In some types of semiconductor processing, a wafer or substrate may be processed within a processing chamber that may include a pedestal or support structure on which the wafer may be placed during such processing. It should be understood that the terms "wafer," "substrate," or "semiconductor substrate" may be used interchangeably herein.

During semiconductor processes, a wafer may be secured in place within a semiconductor processing chamber and on the pedestal by an electrostatic chuck (ESC). Some ESCs hold a wafer, which may be electrostatically charged as a result of processing operations, in place by applying a direct current ("DC") voltage to one or more clamping electrodes within the ESC such that the clamping electrode(s) and the wafer act as a capacitive circuit. Clamping electrode(s) are typically thin, planar structures that are parallel to the overall plane of the wafer, and often extend across a region commensurate with the wafer size. The electrostatic force that arises due to the capacitive effect provides the clamping force.

Because of the presence of the conductive electrodes and the associated electrically conductive signal cables to provide power and control signals, an ESC where the DC and RF power supply are off will still have RF characteristics. The RF characteristics of an ESC in the passive state will vary based on the specific design of the ESC, such as but not limited to whether the design is monopolar or bipolar, the geometric configuration of the electrodes, and the geometric configuration of the cables or wires leading to the electrodes. Any asymmetry in the RF structure of the ESC may perturb the uniformity of the RF field during semiconductor processing, thereby causing nonuniformity in the critical dimensions of the processed wafer.

The present inventors have conceived of an apparatus for identifying RF asymmetries introduced by different ESC and cathode designs. By being able to perform a deep characterization of asymmetry effects, various improvements to existing RF bias system designs that may offer enhanced performance may be achieved.

Another issue that the present inventors identified was that the routing of cables within the cathode or under and around the ESC may have a significant impact on semiconductor processing chamber performance in terms of etch and/or deposition uniformity of wafer. A pedestal having an ESC, RF electrode, heater, and/or sensors may have a number of different cables routed to it that conduct power or signals to and/or from the various electrical systems within the pedestal, including, for example, to the clamping electrode(s), the RF electrode(s), and the heater (if present), as well as potential cables for a temperature sensor or sensors and non-electrical conduits, such as coolant hoses or the like. Each of these cables or conduits is typically routed from devices, e.g., high-voltage DC power sources for ESC clamping, high-voltage RF power sources for plasma generation, heat exchanger systems for supplying coolant liquid, controllers that may provide control signals or receive sensor signals, etc., located external to the processing chamber, through whatever structure supports the pedestal and ESC, and to the underside of the pedestal, where such cables and conduits are then connected to various connection points on the underside of the pedestal within the interior of the processing chamber which may include an area below and at least partially surrounding the pedestal and ESC, sometimes referred to as a "bowl."

The present inventors determined that cable location and routing within the bowl may actually directly affect uniformity for wafers processed in a given semiconductor processing chamber, as well as chamber-to-chamber variability—even though the ESC itself may be interposed between these cables and the wafer and even though such cable routing is typically not apparent from within the semiconductor processing chamber since it occurs either within the pedestal/ESC or underneath the pedestal/ESC, and may not be visible when viewing a wafer from the top side of the ESC. Uniformity is important, as it indicates how likely it is that a fixed set of process conditions used in a semiconductor processing chamber will lead to a desired result, i.e., a processed wafer with low feature loss. Chamber-to-chamber variability is also important, as it indicates how likely it is that process parameters developed for one semiconductor processing chamber will be effective when used in a similar semiconductor processing chamber As a further example of how cable placement affects process variability, the present inventors found that in certain etch processes, securing a cable from a loose position to a fixed position decreased the variability between processed wafers. For example, the inventors secured a voltage control interface wire, a wire that travels from the exterior to the interior of the semiconductor processing chamber and measures the RF voltage of the RF electrode of the ESC, to a single, fixed configuration within a processing chamber, which resulted in a decrease in the variability of processed wafers.

In response to at least some of the above issues identified by the present inventors, the present inventors determined that characterizing the RF field asymmetry effects using a probe assembly implemented using one or more of the design options discussed below, or equivalents thereof, may facilitate identifying the design parameters of ESCs, the routing of cables within the semiconductor processing chamber, and other component designs or locations that could be changed in order to significantly improve RF field symmetry and the resulting uniformity of the critical dimensions for processed wafers.

Such RF asymmetry characteristics of semiconductor processing chambers may be evaluated using a new apparatus and method developed by the inventors. Generally speaking, a conductive probe may be mounted to a radial structure that may be positioned within the semiconductor processing chamber; the radial structure may be configured to be rotatable about a center axis of the wafer within the semiconductor processing chamber, thereby allowing the conductive probe to be moved azimuthally. In some implementations, the conductive probe may also be configured to be movable radially, thereby allowing the conductive probe to be positioned at nearly any position across the wafer support within an annular or circular region centered on the wafer support. In various implementations, the radial structure and conductive probe may be suspended from the lid or top of the semiconductor processing chamber.

In some instances, an electrically conductive, protective plate may be placed on the wafer support and interposed between the conductive probe and the wafer support so that the plate rests on the wafer support and the conductive probe rests on the plate. In other implementations, the conductive probe may rest directly on the wafer support, although this may expose the wafer support to potential damage if the conductive pin is moved horizontally across the wafer support while in contact with the wafer support. The conductive pin may be electrically isolated from the semiconductor processing chamber, but there may be an electrically conductive path (which may include, for example, the radial structure) that passes through, for example, the lid of the semiconductor processing chamber. This conductive path may maintain the electrical isolation from the semiconductor processing chamber to form a coaxial connection with a network analyzer. The network analyzer can then measure the RF characteristics of the cathode structure in an unloaded condition (i.e., no plasma) at various azimuthal and radial locations—this allows for the identification of potential root causes to hotspots/non-uniformities on the wafer.

Additionally, the same measurements at the same locations may be taken repeatedly, but with different components within the wafer support and/or semiconductor processing chamber removed or repositioned to determine the degree to which each such component contributes to any observed asymmetries. For example, if a hotspot is identified through such measurements and then exhibits a greatly decreased magnitude when a particular component is removed, then this suggests that something about the removed component may be contributing to RF field non-uniformity in an undesirable manner. That component can then potentially be relocated to see if other mounting locations result in a decreased hotspot magnitude, and the component may potentially be re-located to such a new location if it improves the RF symmetry. Alternatively, the component in question may simply be re-designed, or perhaps alternative components or systems may be used to avoid reliance on the problematic component.

FIG. 1 depicts a RF asymmetry test setup 100 having a process chamber 106 for performing a variety of semiconductor processing operations, including but not limited to conductor etching. The process chamber 106 includes a center axis 198. For the purposes of description herein, the radial direction is used to refer to directions that are perpendicular to, and intersect with, the center axis 198 and azimuthal directions are used to refer to directions that are perpendicular to those radial directions and that are also parallel to a plane that is perpendicular to the center axis 198.

FIG. 1 depicts an example of a conductive plate 118 that may be disposed above a pedestal 112 in the process chamber 106. Possible advantages of the conductive plate 118 may include protecting the surface of the pedestal 112 from damage by the conductive pin 130 that may be compression loaded by a spring in a conductive pin holder 134, preventing deposit of residues that may act as contaminants on the surface of the pedestal 112, providing a low friction surface to allow a conductive pin 130 to be azimuthally or radially displaced without undue resistance, and increasing the capacitive coupling with an electrode 116 in pedestal 112. One possible advantage of the direct physical contact of the conductive pin 130 onto the conductive plate 118 that provides a large capacitance to couple with the electrode 116 in pedestal 112 may be increasing the repeatability of measurements such as impedance and other S parameters for characterizing asymmetry effects. In certain implementations, the conductive plate 118 may have a coating made of material such as Kapton on the side facing the pedestal 112 to further protect the surface of the pedestal 112.

For example, while it may be possible to use the conductive probe (conductive pin) without the conductive plate to obtain the desired measurements, it would be necessary to have the conductive probe contact the surface of the wafer support/pedestal instead, which would potentially expose the wafer support or pedestal to damage and might produce varying degrees of capacitive coupling (unrelated to potential RF asymmetries) if the distance between the conductive probe and the electrode within the pedestal varies due to surface features of the wafer support or pedestal. Alternatively, the conductive plate may be omitted and the conductive probe may instead be positioned just slightly above the wafer support or pedestal, e.g., a few hundredths or thousandths of an inch. In such a configuration, however, any slight non-perpendicularity of the rotational axis of the radial structure that supports the conductive probe with respect to the wafer support surface of the wafer support or pedestal would result in the conductive probe changing its separation distance relative to the RF electrode in the wafer support or pedestal as the conductive probe was moved azimuthally and/or radially. This would cause the capacitive coupling between the conductive probe and the RF electrode to change due to the misalignment of the probe assembly rather than due to issues in the process chamber itself. The use of a spring-loaded pin for the conductive probe, coupled with the conductive plate, allows the distance between the pin and the wafer support or pedestal to remain constant— the plate may be machined to a high degree of flatness and parallelism so that when the plate rests on the wafer support, it mimics the flat nature of a semiconductor wafer (the plate may be made much thicker than a wafer, however, so that the weight of the plate holds it in place on the wafer support even when the probe assembly may be repositioned—such RF measurements may occur when, for example, a wafer securement system such as an ESC may be non-operating) and gives the conductive probe a surface on which to rest. This helps ensure that the vertical positioning of the conductive probe does not affect the RF measurements that are obtained.

It should be appreciated that in certain implementations, a high precision machining process can be used fabricate a radial member 136 such that the conductive pin 130 can be suspended precisely above the surface of the pedestal 112 to prevent damage to the pedestal 112 while still providing a small enough air gap such that there may be strong capacitive coupling of the conductive pin to the electrode 116. It should be further appreciated that regardless of whether a thick conductive plate, a thin conductive plate, a thin air gap, or direct contact with the surface of the pedestal 112, is used, the altitude of the conductive pin 130 relative to the surface of the pedestal 112 is to remain constant during both azimuthal and radial movement in order to obtain reliable measurements of asymmetry effects.

It should be appreciated that the conductive plate 118 modifies the electric field distribution within the process chamber 106 relative to when the conductive plate 118 may be absent. However, in implementations where the conductive plate 118 may be shaped symmetrically, such as a disk shape, and may be disposed within the process chamber 106 such that a center of symmetry of the conductive plate 118 may be aligned with a center point of the process chamber 106, the relative modification of the electric field within the process chamber 106 may be symmetrical, therefore any underlying asymmetry effects remain measurable.

In certain implementations, the diameter of the conductive plate 118 may be substantially similar to the diameter of the pedestal 112, where substantially similar corresponds to ±10%. It should be appreciated that in implementations where asymmetry effects above a certain radial offset are not being measured, the conductive plate 118 may have a diameter that may be correspondingly reduced. For example, for a pedestal diameter of 20 inches, and a measurement profile only measuring asymmetry effects at a radial offset less than 3 inches, the conductive plate 118 may have a diameter of 6 inches. In such a scenario, the probe assembly may not be intended to be positioned over the portion of the pedestal with a radial offset greater than 3 inches, and therefore the conductive plate 118 can be correspondingly sized. Similar to the above, it should be appreciated that for measurement profiles exceeding a minimum radial offset, the conductive plate 118 may have a circular cutout portion in the center.

In implementations without the conductive plate 118, there may be an air gap between the conductive pin 130 and the pedestal 112. This may result in a small capacitance to couple the electrode 116 in the pedestal 112 and the conductive pin 130, causing measurements on a network analyzer to be highly sensitive, which creates measurement repeatability issues. This in turn may mask the asymmetry effects associated with the larger displacements of the conductive pin 130 in the azimuthal and radial directions. In implementations where the conductive pin 130 rests directly on the pedestal 112, there may be a ceramic layer 114, also referred to as a ceramic puck, which limits the capacitive coupling between the conductive pin 130 and the electrode 116 in pedestal 112. In such implementations, the small capacitance to couple the electrode 116 in the pedestal 112 and the conductive pin 130 causes measurements on a network analyzer to be highly sensitive to changes in pressure applied to the conductive pin 130, which again impacts measurement sensitivity, reliability, and repeatability.

In certain implementations, the thickness of the conductive plate 118 may be approximately 1 inch. It should be appreciated that when the thickness of the conductive plate 118 may be reduced, such as to ⅛ inch, the conductive plate 118 may protect the surface of the pedestal 112, and the material may also have a density such that the weight of the conductive plate 118 may be heavy enough to avoid movement parallel to the surface of the pedestal 112 during movement of the conductive pin 130.

In particular implementations, the conductive plate 118 may be made of a metallic material such as copper, aluminum or brass, and may also be plated with a conductive material such as silver, gold, and so forth.

In specific implementations, the conductive plate 118 may have a hole for interfacing to a removable handle to facilitate placement of the conductive plate 118 onto the pedestal 112.

It should be further appreciated that in certain implementations, the conductive plate 118 may be absent.

The conductive pin 130 may be disposed to make electrical contact with the conductive plate 118. In certain implementations, the conductive pin 130 may be gold plated, and may have a tapered or rounded tip in physical contact with the conductive plate 118. The conductive pin 130 may be supported by the conductive pin holder 134. In specific implementations, the conductive pin holder 134 may be a silver-plated copper pin holder. In certain implementations, the conductive pin holder 134 may include a spring for spring-loading the conductive pin 130 with a compressive force to achieve electrical contact with the conductive plate 118. The conductive pin holder 134 and the conductive pin 130 may be supported by a sliding member 132. The sliding member 132 may slide bidirectionally in a radial orientation.

The sliding member 132 may be supported by the radial member 136. In certain implementations, the radial member 136 may be made of silver-plated copper material. The radial member 136 may include a first end and a second end. In such implementations, the first end may set the maximum radial offset for the conductive pin holder 134, though it should be appreciated that the maximum radial offset may be limited by factors other than the length provided by the first end of the radial member 136. Furthermore, in such implementations, the second end of the radial member 136 may be positioned in the process chamber 106 such that rotational axis of the radial member 136 may be aligned with the central axis of the pedestal 112.

Figure 2:
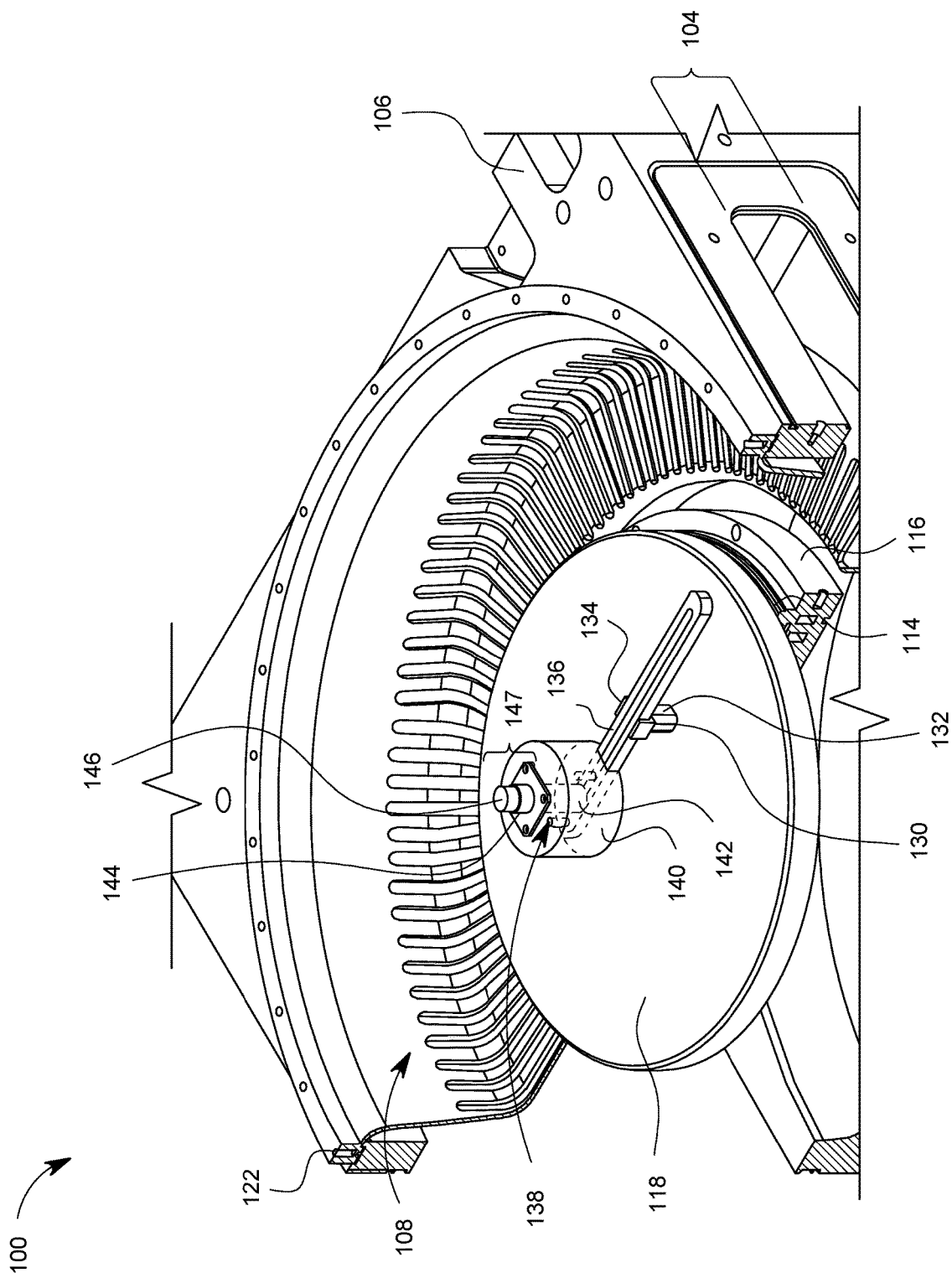
FIG. 2 depicts a further view of an example configuration of a probe assembly for measuring asymmetry effects in a semiconductor processing chamber.

In FIG. 2, the radial member 136 may include a guide for supporting the sliding member 132. In certain implementations, the guide corresponds to a slot that runs in the elongated axis of the radial member 136, and may be the same thickness as the radial member 136. In certain implementations, the conductive pin holder 134 includes a lip such that a portion of the conductive pin holder 134 may be wider than the cavity in the radial member 136, thereby allowing the conductive pin holder 134 to be suspended above the conductive plate 118. In other implementations, the conductive pin holder 134 may be secured to the radial member 136 using a screw clamp. It should be appreciated that other mechanisms for fastening the conductive pin holder 134 to the radial member 136 may be used, such as a tongue and groove interface, a friction fit, and so forth. It should further be appreciated that the conductive pin holder 134 may be fastened to the radial member 136 using a mechanism that may require disengagement prior to radial displacement of the conductive pin holder 134.

In certain implementations, an insulator 140 may be interposed in the separation distance between a grounding plate 124 (as shown in FIG. 1) and the radial member 136. The insulator 140 may support the radial member 136, and may also support the linear translation mechanism when present. In one implementation, the radial member 136 and the insulator 140 are fastened by radial member locking pins 138. The grounding plate 124 may support the insulator 140. In some implementations, the insulator 140 and the grounding plate 124 may be fastened together by insulator locking pins 150 shown in FIG. 3. It should be appreciated that alternatives to locking pins include screws, a threaded collar, a tongue and groove, and so forth. It should further be appreciated that the insulator locking pins 150 may be arranged to achieve symmetry, which in some cases may result in the number of insulator locking pins 150 to exceed the minimum number for structural stability. The insulator 140 may be solid material, or have a hollow interior. It should be noted that the insulator 140 may be implemented in shapes other than a cylinder. The insulator 140 may be made of electrically insulating material, such as a ceramic material, Teflon, a silicone, a polyimide, Polyether ether ketone (PEEK), and so forth.

In an exemplary implementation, the insulator 140, the grounding plate 124, and the radial member 136 are interconnected to form a rigid assembly that may be rotatable such that the conductive pin 130 may be positioned at different azimuthal angles to provide an assessment of the asymmetry effects in process chamber 106. In such an implementation, the insulator 140 may provide an electrically insulating layer to prevent coupling of the RF hot signal on the radial member 136 to the grounding plate 124, and may further provide structural coupling between the radial member 136 and the grounding plate 124. In addition to providing electrical ground, the grounding plate 124, being part of a rotatable assembly, may include index lines indicating azimuthal rotation angles, thereby serving as a dial plate allowing the rotation of the grounding plate 124 (and attached components) to be indexed to a desired angular displacement.

Figure 3:
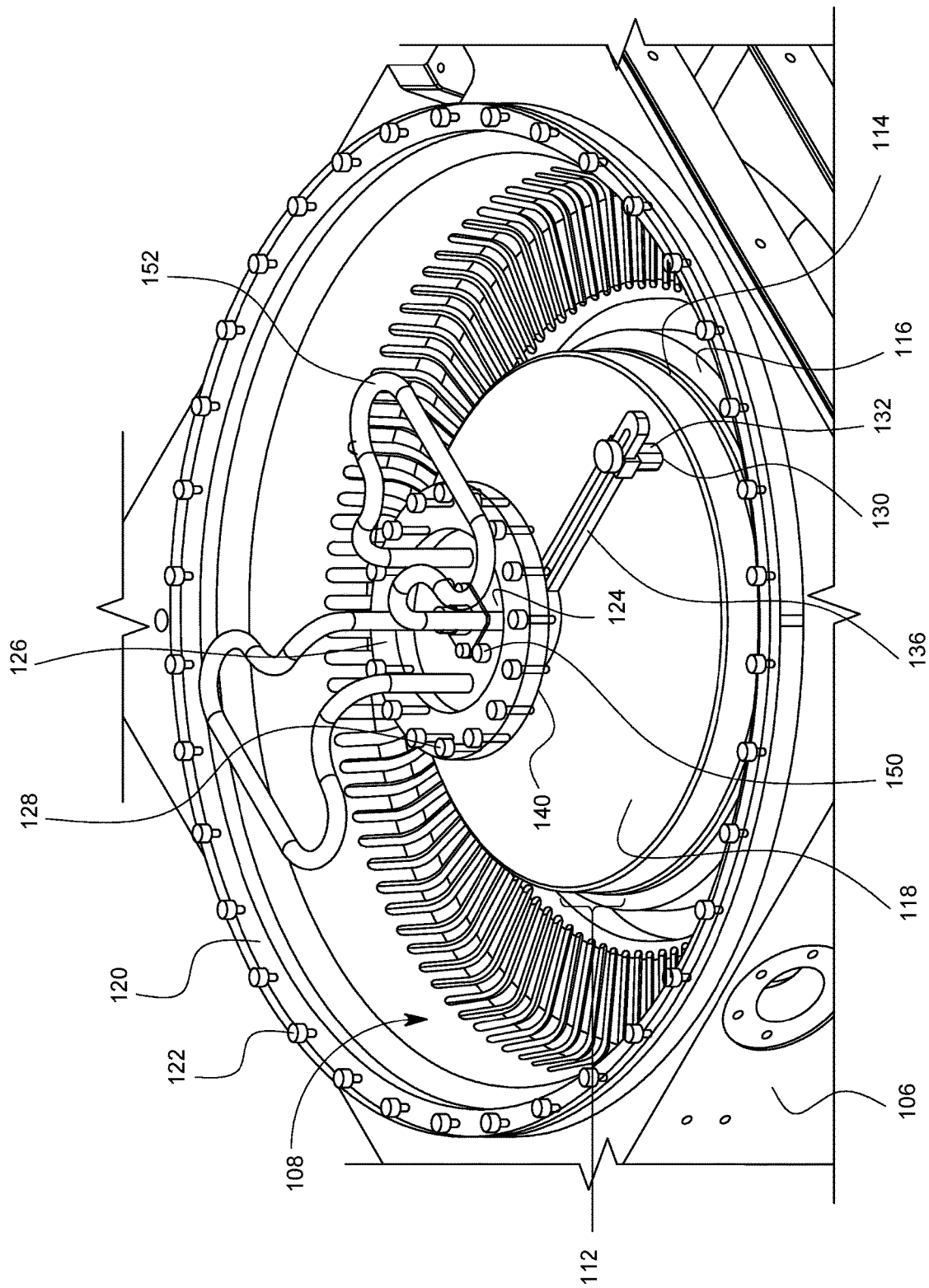
FIG. 3 depicts yet another view of an example configuration of a probe assembly for measuring asymmetry effects in a semiconductor processing chamber.

FIG. 3 depicts a clamp ring 126 applying a compressive force on the grounding plate 124 to increase the contact pressure with a grounding cover 120. In certain implementations, the grounding plate 124, the clamp ring 126, and the grounding cover 120, by being in physical contact and by being made of metallic material, provide a ground shield covering the entire opening of the process chamber 106 facing the top of the pedestal 112. One possible advantage of such an implementation may be minimizing coupling of the conductive pin 130 with inductive and capacitive elements above the plane of the grounding cover 120. The clamp ring 126 may be fastened to the grounding cover 120 using the clamp ring locking pins 128. It should be noted that other fasteners, such as screws and so forth, may be used.

As shown in the example implementation of FIG. 3, the radial offset of the inner diameter of the clamp ring 126 is less than the outer diameter of the grounding plate 124, therefore the two components overlap. Furthermore, the radial offset of the outer diameter of the clamp ring 126, which is where the clamp ring locking pins 128 that are fastened to grounding cover 120 are approximately located, is greater than the outer diameter of the grounding plate 124. Therefore, the clamp ring 126 is rigidly attached to the grounding cover 120 in a manner that compresses the grounding plate 124 against the grounding cover 120. In some implementations, the clamp ring locking pins 128 may be loosened or removed prior to rotating the grounding plate 124. In implementations where azimuthal degrees are marked on the grounding plate 124, the grounding plate 124 functions as a dial plate that indicates the azimuthal angle of the conductive pin 130 relative to a static marker on the clamp ring 126.

A grounding plate handle 152 may be attached to the grounding plate 124. Using the grounding plate handle 152 to rotate the grounding plate 124 causes the conductive pin 130 to undergo azimuthal rotation without removing the grounding cover 120. The grounding cover 120 may be fastened to a test liner 108 using clamp ring locking pins 122. It should be noted that other fasteners, such as screws and so forth, may be used.

It should be appreciated that other variants of rotatable interfaces may be used. In some implementations, the grounding plate 124 and the clamp ring 126 may be optional. For example, the radial member 136 may include or may be attached to a protrusion in a direction away from the face of the conductive plate 118 that acts as a conductive path for an RF signal. The protrusion may be surrounded by insulator 140 to prevent electrical contact between the grounding cover 120 and the conductive path electrically coupled to the radial member 136. The insulator 140 may be interfaced to the grounding cover 120 to form a plain bearing assembly, with the insulator 140 acting as a journal and an inner surface of grounding cover 120 acting as a bearing surface.

In various implementations, the insulator 140 may be interfaced to the inner race of a ball bearing rotatable interface, and the protrusion included on radial member 136 may act as an axle for the ball bearing rotatable interface. The outer race of the ball bearing rotatable interface may be interfaced to, or integrally formed with the grounding cover 120. In some implementations, where the ball bearings may be made of insulating materials, or the interface between the outer race and the grounding cover 120 are made of insulating materials, surrounding the protrusion on the radial member 136 with the insulator 140 may be optional.

Returning to FIG. 1, in particular implementations, the radial member 136 may include a protrusion 142 in a direction away from the face of the conductive plate 118. The protrusion 142 may be tapered to reduce capacitive coupling between the "RF hot" signal being carried on the radial member 136 and the grounding plate 124, disposed at a separation distance above the radial member 136. In certain implementations, the protrusion 142 may make electrically conductive contact with a connector assembly conductor 146 in a connector assembly 147 such that a cable coupled to the connector assembly 147 can propagate the RF hot signal to a device such as a network analyzer. In an example implementation, the conductive pin 130, the conductive pin holder 134, the radial member 136, the protrusion 142, the connector assembly conductor 146 in the connector assembly 147, together with a coaxial cable coupled to the connector assembly 147 and a network analyzer, provide a conductive path from the conductive pin 130 to the network analyzer. The connector assembly conductor 146 in the connector assembly 147 may have a cylindrical ground surface, such as a connector assembly ground surface 144. It should be appreciated that in other implementations, the protrusion 142 may extend through an aperture in the grounding plate 124, rather than coupling to the connector assembly 147 in the same plane as the grounding plate 124. In such implementations the protrusion 142 may not have a taper. It should further be appreciated that the protrusion 142 may transition into a wire, or couple to a wire, which in turn may be coupled to the connector assembly conductor 146 at a location other than on the same plane as the grounding plate 124.

In certain implementations, the radial offset of a conductive pin holder 434 may be performed manually by removing a radial member 436 from the process chamber by disengaging a thumbscrew and sliding the conductive pin holder 434 to a particular position indicated by a scale on the radial member 436. In other implementations, the radial offset may be performed using a mechanism such as linear translation mechanisms 470A-C in FIGS. 4A-D that allow the radial member 436 to remain in the process chamber. It should be appreciated that mechanical members for linearly displacing the conductive pin holder 434 to a particular radial offset may be a single rigid body, such as an elongated bar that may be configured to travel parallel to the elongated axis of the radial member 436. Alternatively, the mechanical member may be articulated.

Figure 4A:
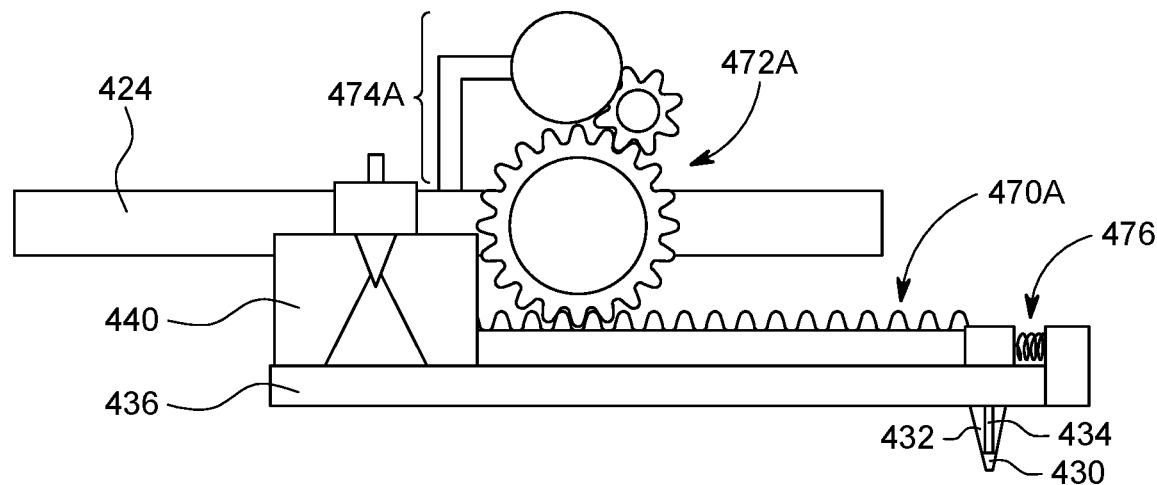
FIGS. 4A-4D depict examples of linear translation mechanisms for changing the radial offset of a conductive pin.

It should be appreciated that as an alternative to linear to linear conversion, rotation to linear conversion may be used. Examples of rotation to linear actuators include mechanisms using a leadscrew, rack and pinion, chain drive, belt drive, cam system, and so forth. FIG. 4A, as a nonlimiting example, illustrates how the rotation of pinion 472A can be used to linearly translate linear translation mechanism 470A.

Figure 4B:
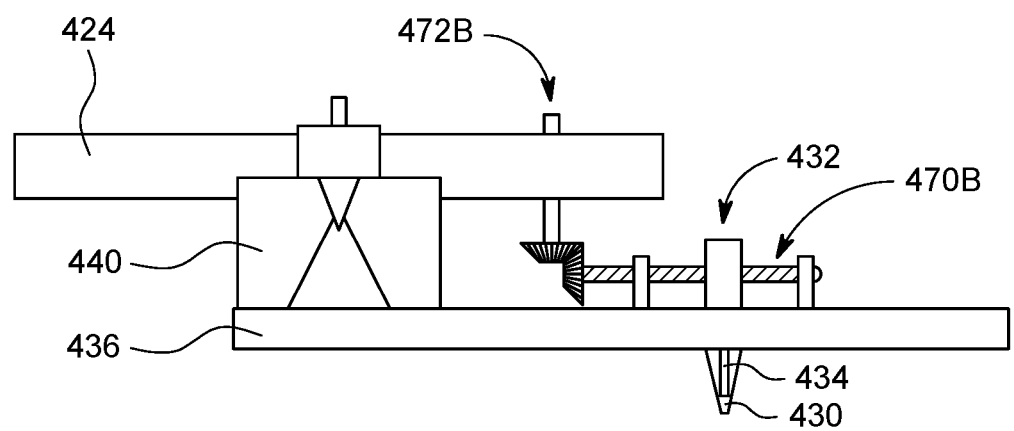

FIG. 4B is another example implementation that illustrates how the rotation of screw 472B can be used to radially offset a sliding member 432, which supports the conductive pin holder 434 and a conductive pin 430. The linear translation mechanism 470B corresponds to a leadscrew, and may be interfaced to screw 472B such that rotation of screw 472B results in a rotation of the leadscrew. The leadscrew corresponding to the linear translation mechanism 470B may be structurally supported by radial member 436 such that the leadscrew remains stationary in the radial direction during rotation of screw 472B, and that rotation of the leadscrew causes a radial translation of sliding member 432.

Figure 4C:
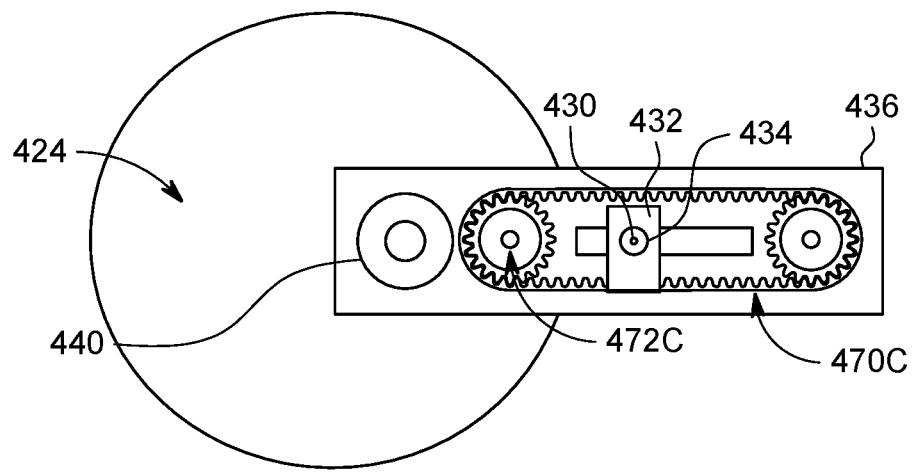
Figure 4D:
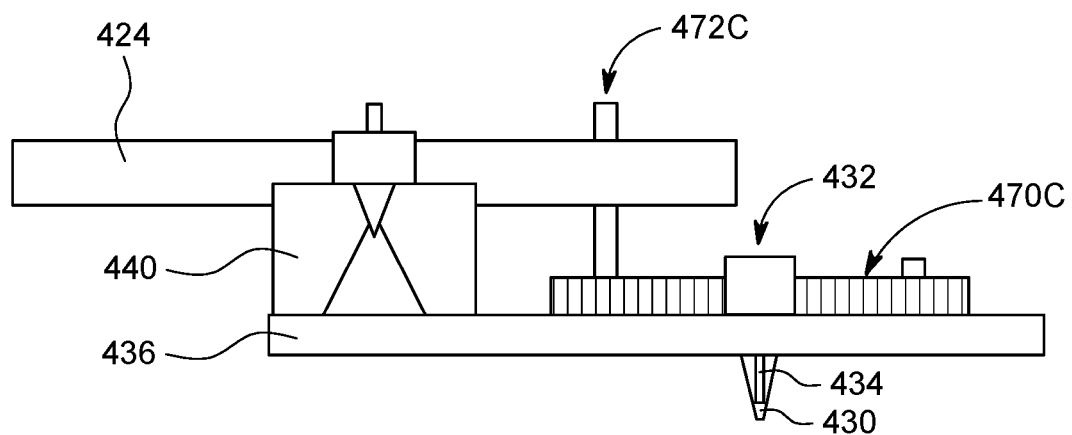

FIGS. 4C-D are a top view and side view, respectively, of an example implementation that illustrates how the rotation of gear 472C can be used to radially offset the sliding member 432. The linear translation mechanism 470C corresponds to a gear belt that may be interfaced to gear 472C and sliding member 432. Rotation of gear 472C may cause the gear belt corresponding to the linear translation mechanism 470C to undergo a partial revolution that may cause a radial translation of sliding member 432. It should be appreciated that in alternative implementations, the gear belt can be a non-geared belt, a chain belt, and so forth.

It should be appreciated that a grounding plate 424 above the radial member 436 includes an aperture such that a portion of the linear translation mechanism may be accessible from the side of the grounding plate 424 facing away from the pedestal. This exposed portion allows actuation of the linear translation mechanism to control the radial offset of the conductive pin holder 434 while the radial member 436 may be within the process chamber. As a nonlimiting example, the pinion 472A in a rack and pinion assembly shown in FIG. 4A may protrude through this aperture in the grounding plate 424, allowing rotation of the pinion 472A, and therefore translation of the conductive pin holder 434, without removing the radial member 436 from the process chamber. Similarly, in FIG. 4B the linear translation mechanism 470B can be actuated by the rotation of the screw 472B without removing the radial member 436 from the process chamber. As yet another example, in FIGS. 4C-D, gear 472C can be rotated to actuate the linear translation mechanism 470C without removal from the process chamber.

It should be appreciated that the aperture in grounding plate 424 to allow accessing 472A-C, corresponding to the pinion 472A, screw 472B, and gear 472C, respectively, may not be aligned with the center of grounding plate 424. However, grounding plate 424 may be structurally coupled to insulator 440, which in turn is structurally coupled to the radial member 436 that may support the linear translation mechanisms 470A-C, therefore rotation of the grounding plate 424 causes a corresponding rotation for the aperture, for example, for pinion 472A. It should be appreciated that the inner diameter of grounding cover 120 (not shown in FIG. 4A-D) may be configured such that the aperture in grounding plate 424 for pinion 472A may be unobstructed by grounding cover 120.

It should be appreciated that the linear translation mechanism may be made of materials that have the characteristics of low inductance and low capacitance, such as but not limited to electrical insulators, that thereby reduce distortions to measuring asymmetry effects caused by asymmetry associated with the linear translation mechanism itself. It should further be appreciated that any electrically conductive elements that may be present in the linear translation mechanism may be electrically insulated using either an air gap or an electrically insulating sleeve.

Activation of the linear translation mechanism may be manual, or with a linear translation mechanism actuator. In implementations with the linear translation mechanism actuator, the actuator may be an electromechanical actuator, hydraulic actuator, pneumatic actuator, and so forth. It should be appreciated that the effect of electrical reactances such as inductances and capacitances introduced by the linear translation mechanism actuator, such as an electromagnet, may be reduced by the grounding plate 424 interposed between the linear translation mechanism actuator and the linear translation mechanism. It should be noted that the size of apertures in the grounding plate 424 are kept to a minimum to reduce unwanted reactive coupling. As a nonlimiting example, the pinion 472A in a rack and pinion assembly shown in FIG. 4A may be actuated by coupling to a gear at the output of a rotary motor assembly 474A that may be mounted to the grounding plate 424. It should further be appreciated that linear translation mechanism actuators may also be interfaced to alternative implementations of linear translation mechanisms, including but not limited to the screw 472B or the gear 472C.

The linear translation mechanism may provide bidirectional forces for bidirectional linear translation of the conductive pin holder 434. Alternatively, linear translation mechanism may provide a unidirectional force for linear translation of the conductive pin holder 434 along one direction, while a restorative member supported on the radial member 436, such as a restorative spring 476, provides a force for translation in the reverse direction.

In certain implementations, a "dummy" duplicate of the linear translation mechanism may be included to increase the symmetry of the measurement apparatus.

It should be noted that in certain implementations, a radial member 536 can include multiple symmetrical spokes, such as at the 0, 90, 180, and 170 azimuthal angles. In such implementations, the endpoint for each spoke may each have an instance of a conductive pin holder 534. In certain implementations, the distance between each instance of the conductive pin holder 534 may be about 1 cm.

Figure 5A:
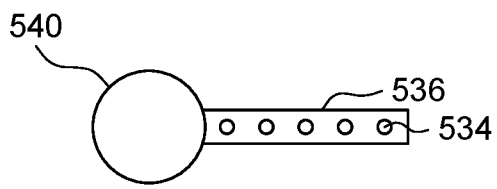
FIG. 5A-5D depict examples of multiplexed probe assembly configurations.
Figure 5B:
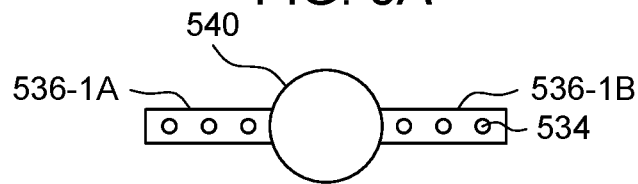
Figure 5C:
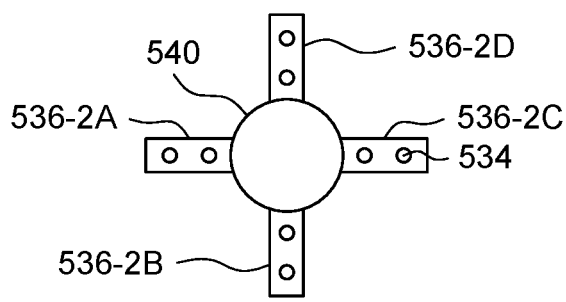
Figure 5D:
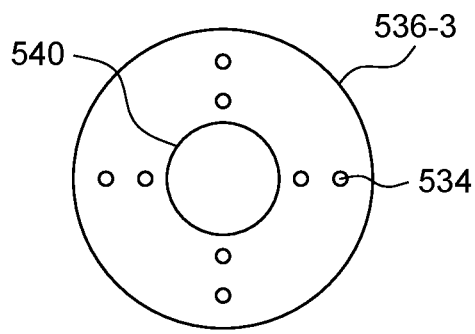

In implementations of the radial member 536, including a single spoke and multiple spokes, there may be multiple instances of the conductive pin holder 534 distributed along the radial member 536. For example, in the configuration of FIG. 5A, the radial member 536, which may be structurally supported by insulator 540, has a uniform distribution of five instances of the conductive pin holder 534, corresponding to radial offsets of 1, 2, 3, 4, and 5 centimeters. FIG. 5B is an example configuration that may be more symmetrical than FIG. 5A. In FIG. 5B, each of the two radial members 536-1A and 536-1B have a uniform distribution of three instances of the conductive pin holder 534, corresponding to radial offsets of 1, 3, 5 and azimuthal offsets of 0 and 180 degrees. FIG. 5C is yet another example configuration that may be symmetrical. In FIG. 5C, each of the four radial members 536-2A through 536-2D have a uniform distribution of two instances of the conductive pin holder 534, corresponding to radial offsets of 1 and 5 centimeters with azimuthal offsets of 0, 90, 180, and 170 degrees. In FIG. 5D, the radial member 536 includes a disk shape rather than elongated members. In the example configuration, the disk shape supports the same radial and azimuthal values for each instance of the conductive pin holder 534 as FIG. 5C. In implementations where the radial member 536 may be a disc shape rather than an elongated leg(s), the amount of conductive material should be kept to a minimum to minimize the capacitance between the radial member 536 and the conductive plate 518. It should be appreciated that the shape of the radial member 536 may not be limited to elongated members or a disk shape.

It should be appreciated that for implementations with multiple instances of the conductive pin holder 534, a multiplexing element may be included to select between the signals corresponding to each instance of the conductive pin holder 534. It should further be appreciated that switching circuitry and routing for multiplexed implementations are to be designed to maximize symmetry for the probe assembly in order to avoid introducing asymmetry effects separate from the structure and contents of the process chamber itself. It should also be appreciated that switching circuitry and routing for multiplexed implementations are to be designed to maximize electrical isolation and minimize cross coupling between the conductive paths corresponding to each instance of the conductive pin holder 534.

It should be noted that the inventors contemplate the probe assembly discussed within this disclosure may be used for characterizing asymmetry for any type of semiconductor processing, including, but not limited to, conductor etching, atomic layer deposition, atomic layer etching, chemical vapor deposition, plasma-enhanced chemical vapor deposition, and so forth.

The probe assembly as described herein may aid in characterization of different cathode, ESC, cable layout, and process chamber designs and geometries. For example, for a first configuration of cathode, ESC, cable layout, and process chamber, network analyzer measurement can be taken at azimuthal angles of 0, 90, 180, and 170 degrees, and with radial offsets of 1, 2, 3, 4 cm, etc. to serve as a baseline profile. Then, a second configuration with a new cathode design but the same ESC, cable layout, and process chamber can be measured using the same azimuthal angles and radial offsets. This allows characterization of asymmetry effects caused by the new cathode design relative to the baseline cathode design. It should be appreciated the same principles can be used to isolate asymmetry effects caused by the ESC, cable layout, and process chamber geometry, respectively. It should further be appreciated that in addition to entire assemblies, individual parts (e.g., a particular cathode component, cable, or transfer aperture cover flap) can be removed/introduced in a step-by-step manner to characterize asymmetry effects.

It should be noted that the semiconductor processing tool containing the process chamber 106 may also include a DC supply and a RF generator electrically connected to a respective clamping electrode and RF electrode. During measurement of asymmetry effects caused by the structure and contents of the process chamber 106, such as to detect chamber resonances at particular frequencies, the DC supply and the RF generator are both configured to be off. Shutting off the DC supply may be necessary to prevent damage to the network analyzer.

A network analyzer provides a steady-state stimulus to the conductive pin 430 when making a measurement. The steady-state stimulus corresponds to the intended frequency of operation for the particular process chamber and cathode design in the process chamber. Nonlimiting examples include about 27 kHz, 1 MHz, 13 MHz, and 30 MHz. Nonlimiting examples of measurements to be collected at each frequency include impedance and S parameters. In certain test protocols, a frequency sweep may be used in place of a test at discrete frequencies. It should be appreciated that in addition to the intended frequency of operation, harmonic frequencies can be included.

It should be appreciated that the amount of radial offset and azimuthal rotation to change between measurements depends on the size of the "hotspots," the region within the process chamber corresponding to RF asymmetry that causes nonuniformity in the critical dimensions of a processed wafer. The hotspot may be reflected in the network analyzer measurements based on a non-uniform fluctuation in impedance or S parameters. In some implementations, the size of a hotspot may be about 1 to 2 cm in width. It should further be appreciated that the hotspot may be arbitrarily shaped, and not necessarily circular or quadrilateral.

FIG. 1 illustrates an example of the test liner 108 disposed in the process chamber 106. In some implementations, the test liner 108 may be similar to a liner that may be placed in the process chamber 106 during semiconductor processing. For example, the test liner 108 may include a side aperture corresponding to a wafer transfer aperture 104 in the process chamber 106 for inserting or removing wafers into the process chamber 106 and onto the pedestal 112. In certain implementations, above the topmost plane of the process chamber 106, the test liner 108 may again be similar to a liner that may be used during semiconductor processing. For example, the test liner 108 may have a top portion with a square shape with contours conforming to the top surface of the process chamber 106, and may also have openings for inserting pins to interlock the test liner 108 and the process chamber 106. In other implementations, above the topmost plane of the process chamber 106, the test liner 108 may differ from a liner used during semiconductor processing. For example, the top portion of the test liner 108 maybe circular rather than square, and may lack openings for locking pins or screws for fastening to the process chamber 106. Possible advantages in designs of the test liner 108 that are not locked to the process chamber 106 include the ability to rotate the test liner 108 relative to the process chamber 106, thereby providing a rotational degree of freedom to characterize the test liner for asymmetry effects—for example, if the test liner may be rotated into multiple different orientations while RF measurements are taken with the conductive probe, a set of measurements may be obtained that may illustrate whether or not rotation of the test liner causes any change in the RF uniformity at multiple locations across the wafer support or pedestal. It should be noted that the test liner 108 may be secured to the process chamber 106 without using the locking pins or screws, such as by using test liner straps in the bowl region of the process chamber 106. It should be appreciated that process chambers corresponding to different manufacturers, model numbers, revisions, etc. may have different corresponding test liner designs, thus the example designs of the test liner 108 described herein are nonlimiting. It should be further appreciated that in certain implementations, the test liner 108 may be absent.

Unless the context of this disclosure clearly requires otherwise, throughout the description and the claims, the words "comprise," "comprising," and the like are to be construed in an inclusive sense as opposed to an exclusive or exhaustive sense; that is to say, in a sense of "including, but not limited to." Words using the singular or plural number also generally include the plural or singular number respectively. Additionally, the words "herein," "hereunder," "above," "below," and words of similar import refer to this application as a whole and not to any particular portions of this application. When the word "or" is used in reference to a list of two or more items, that word covers all of the following interpretations of the word: any of the items in the list, all of the items in the list, and any combination of the items in the list. The term "implementation" refers to implementations of techniques and methods described herein, as well as to physical objects that embody the structures and/or incorporate the techniques and/or methods described herein.

There are many concepts and implementations described and illustrated herein. While certain features, attributes and advantages of the implementations discussed herein have been described and illustrated, it should be understood that many others, as well as different and/or similar implementations, features, attributes and advantages of the present inventions, are apparent from the description and illustrations. As such, the above implementations are merely exemplary. They are not intended to be exhaustive or to limit the disclosure to the precise forms, techniques, materials and/or configurations disclosed. Many modifications and variations are possible in light of this disclosure. It is to be understood that other implementations may be utilized and operational changes may be made without departing from the scope of the present disclosure. As such, the scope of the disclosure is not limited solely to the description above because the description of the above implementations has been presented for the purposes of illustration and description.

Importantly, the present disclosure is neither limited to any single aspect nor implementation, nor to any single combination and/or permutation of such aspects and/or implementations. Moreover, each of the aspects of the present disclosure, and/or implementations thereof, may be employed alone or in combination with one or more of the other aspects and/or implementations thereof. For the sake of brevity, many of those permutations and combinations will not be discussed and/or illustrated separately herein.

What is claimed is:

1. An apparatus for evaluating radio-frequency (RF) electromagnetic field symmetry of an electrode of a pedestal of a semiconductor processing chamber, the apparatus comprising:
a radio-frequency (RF) probe assembly configured to rotate about a first axis relative to a grounding plate, the grounding plate configured to interface with the semiconductor processing chamber and including an aperture, wherein the RF probe assembly includes:
a radial member positioned on a first side of the grounding plate that faces the pedestal when the grounding plate is interfaced with the semiconductor processing chamber,
a first conductive pin that is supported by the radial member and radially offset from the first axis along a second axis perpendicular to the first axis, and
a first electrically conductive path leading from the first conductive pin, through the aperture, and to a location accessible from a second side of the grounding plate that is opposite the first side, wherein the first electrically conductive path is electrically isolated from the grounding plate.

2. The apparatus of claim 1, wherein the first electrically conductive path terminates at a coaxial RF connector assembly.

3. The apparatus of claim 1, wherein the first electrically conductive path is removably coupled to a network analyzer for making a measurement from the group consisting of: a resistance, a capacitance, and an impedance.

4. The apparatus of claim 1, wherein:
the RF probe assembly further includes a sliding member;
the sliding member is configured to translate along the second axis and is supported by the radial member, and
the sliding member supports the first conductive pin.

5. The apparatus of claim 4, wherein:
the RF probe assembly further includes a linear translation mechanism configured to translate the sliding member along the second axis responsive to a mechanical input provided to a mechanism accessible from the second side, wherein the linear translation mechanism includes at least one mechanism selected from the group consisting of: 1) a lead screw, 2) a rack and pinion, and 3) a chain or belt drive.

6. The apparatus of claim 1, wherein:
the RF probe assembly further includes a second conductive pin supported by the radial member, the second conductive pin being coupled to a second electrically conductive path, wherein the first electrically conductive path and the second electrically conductive path are coupled to a multiplexer configurable to select between the first conductive pin and the second conductive pin.

7. The apparatus of claim 1, wherein the first conductive pin is spring-loaded such that the first conductive pin is biased to slide away from the grounding plate and along an axis parallel to the first axis.

8. The apparatus of claim 1, further comprising an insulator between the grounding plate and the radial member;
the insulator having a first end accessible from the second side of the grounding plate; and
the insulator having a second end connected to the radial member such that rotation of the insulator along the first axis causes a rotation of the radial member along the first axis, wherein:
a length of the insulator provides a separation distance along the first axis between the grounding plate and the radial member, and
the insulator is made of electrically insulating solid material selected from the group consisting of: a ceramic material, Teflon, a silicone, and a polyimide.

9. The apparatus of claim 8, further comprising an electrically conductive plate configured to contact a first end of the first conductive pin, wherein: the first end of the first conductive pin is oriented away from the first side of the grounding plate, and
    the electrically conductive plate is made of material selected from the group consisting of: aluminum and brass.

10. The apparatus of claim 9, further comprising a semiconductor processing chamber having the pedestal, wherein the grounding plate is interfaced to the semiconductor processing chamber.

11. The apparatus of claim 10, further comprising a semiconductor processing tool, wherein the semiconductor processing tool comprises:
    the semiconductor processing chamber and the pedestal, wherein the pedestal includes an electrostatic chuck;
    a second electrically conductive path that extends from outside the semiconductor processing chamber to a location in electrically conductive contact with the electrostatic chuck and inside the semiconductor processing chamber; and
    a high-voltage radio frequency (RF) generator configured to provide RF energy, the high-voltage RF generator being electrically connected to the second electrically conductive path at one or more locations outside of the semiconductor processing chamber.

12. The apparatus of claim 10, wherein the electrically conductive plate is interposed between the first conductive pin and the pedestal,
    the electrically conductive plate has a thickness that causes the electrically conductive plate to simultaneously contact the first conductive pin and the pedestal when the electrically conductive plate is supported by the pedestal and the pedestal is at a first height in the semiconductor processing chamber, and
    the electrically conductive plate has a diameter that is substantially similar to a diameter of the pedestal.

13. A method for operating an apparatus for evaluating radio-frequency (RF) electromagnetic field symmetry of an electrode of a pedestal of a semiconductor processing chamber, apparatus including an FR probe assembly and the method comprising:
    measuring a first radio-frequency (RF) signal at a first position using the RF probe assembly, the RF probe assembly configured to rotate about a first axis relative to a grounding plate, the grounding plate configured to interface with the semiconductor processing chamber, the grounding plate including an aperture, wherein the RF probe assembly includes:
        a radial member positioned on a first side of the grounding plate that faces the pedestal when the grounding plate is interfaced with the semiconductor processing chamber,
        a first conductive pin that is supported by the radial member and radially offset from the first axis along a second axis perpendicular to the first axis, and
        a first electrically conductive path leading from the first conductive pin, through the aperture, and to a location accessible from a second side of the grounding plate that is opposite the first side, wherein the first electrically conductive path is electrically isolated from the grounding plate; and
    measuring a second radio-frequency (RF) signal at a second position using the RF probe assembly, wherein the first position and the second position are symmetric in a plane parallel to the second axis.

14. The method of claim 13, wherein the first electrically conductive path terminates at a coaxial RF connector assembly.

15. The method of claim 13 further including coupling the first electrically conductive path to a network analyzer for making a measurement from the group consisting of: a resistance, a capacitance, and an impedance.

16. The method of claim 13, wherein:
    the RF probe assembly further includes a sliding member;
    the sliding member is configured to translate along the second axis and is supported by the radial member, and
    the sliding member supports the first conductive pin, wherein the method further comprises obtaining multiple measurements from the first conductive pin for various positions of the first conductive pin along the second axis.

17. The method of claim 16, wherein the RF probe assembly further includes a linear translation mechanism configured to translate the sliding member along the second axis responsive to a mechanical input provided to a mechanism accessible from the second side, the linear translation mechanism includes at least one mechanism selected from the group consisting of: 1) a lead screw, 2) a rack and pinion, and 3) a chain or belt drive, and the method further comprises activating the linear translation mechanism to move the first conductive pin to each position along the second axis at which a measurement is obtained.

18. The method of claim 13, wherein: the RF probe assembly further includes a second conductive pin supported by the radial member, the second conductive pin being coupled to a second electrically conductive path, the first electrically conductive path and the second electrically conductive path are coupled to a multiplexer configurable to select between the first conductive pin and the second conductive pin, and the method further comprises switching an input of the multiplexer between the first electrically conductive path and the second electrically conductive path.

19. The method of claim 13, wherein the first conductive pin is spring-loaded such that the first conductive pin is biased to slide away from the grounding plate and along an axis parallel to the first axis.

20. The method of claim 13, wherein:
    the apparatus further comprises an insulator between the grounding plate and the radial member,
    the insulator has a first end accessible from the second side of the grounding plate,
    the insulator has a second end connected to the radial member such that rotation of the insulator along the first axis causes a rotation of the radial member along the first axis,
    a length of the insulator provides a separation distance along the first axis between the grounding plate and the radial member, and
    the insulator is made of electrically insulating solid material selected from the group consisting of: a ceramic material, Teflon, a silicone, and a polyimide.

21. The method of claim 20, wherein:
    the apparatus further comprises an electrically conductive plate configured to contact a first end of the first conductive pin,
    the first end of the first conductive pin is oriented away from the first side of the grounding plate,
    the electrically conductive plate is made of material selected from the group consisting of: aluminum and brass, and the method further comprises placing the electrically conductive plate on the pedestal such that the electrically conductive plate is in electrically conductive contact with the pedestal and with the first conductive pin.

22. The method of claim 21, wherein the apparatus further comprises the semiconductor processing chamber having the pedestal, the method further comprising interfacing the grounding plate to the semiconductor processing chamber.

23. The method of claim 22, wherein the apparatus further comprises a semiconductor processing tool, wherein the semiconductor processing tool comprises:
   the semiconductor processing chamber and the pedestal, wherein the pedestal includes an electrostatic chuck;
   a second electrically conductive path that extends from outside the semiconductor processing chamber to a location in electrically conductive contact with the electrostatic chuck and inside the semiconductor processing chamber; and
   a high-voltage radio frequency (RF) generator configured to provide RF energy, the high-voltage RF generator being electrically connected to the second electrically conductive path at one or more locations outside of the semiconductor processing chamber.

24. The method of claim 22, wherein: the electrically conductive plate is interposed between the first conductive pin and the pedestal,
   the electrically conductive plate has a thickness that causes the electrically conductive plate to simultaneously contact the first conductive pin and the pedestal when the electrically conductive plate is supported by the pedestal and the pedestal is at a first height in the semiconductor processing chamber, and
   the electrically conductive plate has a diameter that is substantially similar to a diameter of the pedestal.

* * * * *